United States Patent
Kim et al.

[11] Patent Number: 5,869,404
[45] Date of Patent: Feb. 9, 1999

[54] METHOD FOR FORMING CONTACT HOLE OF SEMICONDUCTOR DEVICE

[75] Inventors: Jeong Ho Kim, Kyoungki-do; Jin Woong Kim, Seoul, both of Rep. of Korea

[73] Assignee: Hyundai Electronics Industries Co., Ltd., Ichon, Rep. of Korea

[21] Appl. No.: 847,811

[22] Filed: Apr. 25, 1997

[30] Foreign Application Priority Data

May 1, 1996 [KR] Rep. of Korea ............... 1996 14113

[51] Int. Cl.⁶ .................................................. H01L 21/00
[52] U.S. Cl. ........................... 438/738; 216/38; 216/46; 216/67; 438/743
[58] Field of Search .................. 216/38, 46, 56, 216/67; 438/696, 697, 699, 710, 723, 724, 743, 744, 738; 252/79.1

[56] References Cited

U.S. PATENT DOCUMENTS

| | | |
|---|---|---|
| 5,022,959 | 6/1991 | Itoh et al. . |
| 5,110,408 | 5/1992 | Fujii et al. . |
| 5,294,294 | 3/1994 | Namose ................................ 216/38 X |
| 5,405,491 | 4/1995 | Shahvandi et al. . |
| 5,700,349 | 12/1997 | Tsukamoto et al. .................. 216/38 X |

*Primary Examiner*—William Powell
*Attorney, Agent, or Firm*—Thelen Reid & Priest LLP

[57] ABSTRACT

A method for forming a contact hole of semiconductor device is disclosed and comprises forming a word line and a first internal insulating film on a semiconductor substrate, forming an insulating film spacer at the side wall of the word line and the first internal insulating film, forming a nitride film as a second internal insulating film at a predetermined thickness on the resultant structure, forming a planarization layer on the second internal insulating film, etching the planarization layer in an atmosphere comprising $C_4F_8$ gas, Ar gas and a hydrogen-containing gas in the presence of a contact mask, to create a contact hole through which the second internal insulating film is exposed. The hydrogen-containing gas acts to generate C—H type polymers weaker in bond strength but at a larger amount than C—C type polymers, thereby preventing the etching stop phenomenon as well as the underlying layer damage caused by overetch during the etching process of a contact hole. This allows the contact hole to be formed without increasing junction leakage current, resulting in a significant improvement in the reliability and the high integration of a semiconductor device.

6 Claims, 2 Drawing Sheets

METHOD FOR FORMING CONTACT HOLE OF SEMICONDUCTOR DEVICE

BACKGROUND OF THE INVENTION

1. Field of the Invention

The present invention relates, in general, to a method for forming a contact hole of a semiconductor device and, more particularly, to the use of hydrogen-containing gas as an etching gas in forming a contact hole, thereby preventing an underlying layer of a planarization layer to be damaged.

2. Description of the Prior Art

In order to better understand the background of the invention, a conventional method for forming a contact hole of a semiconductor device will be described in conjunction with FIG. 1.

Referring to FIG. 1, a semiconductor substrate 31 is provided on which two stacks of a word line 33 and a first internal insulating film 35 are formed. Then, a spacer 37 is formed at the side wall of the stack. Here, the first internal insulating film 35 and the insulating spacer 37 may be made of oxide or nitride.

Next, on the top surface of the resultant structure, a second internal insulating film 39 is deposited at a predetermined thickness, which is, then, covered with a blanket of a step coverage layer for planarization. This planarization layer 41 is typically made of an insulating layer showing good flowage while the second insulating film 39 is made of nitride. For example, spin-on-glass (hereinafter referred to as "SOG") or borophospho silicate glass (hereinafter referred to as "BPSG") may be used for the planarization layer 41.

Thereafter, a photoresist pattern (not shown) is created on the planarization layer 41 by an exposure and developing process using a contact mask (not shown). With the photoresist pattern serving as a mask, the planarization layer 41 is etched to form a contact hole 43 through which the second internal insulating film 39 is exposed. Then, the photoresist pattern is removed.

When $C_4F_8$ and Ar are used as an etching gas for the contact hole 43, either etch stop or breakage of the second internal insulating film 39 as denoted by reference letter "a", occurs frequently. The etch stop is caused when the etching gas is used at flow rates more than a critical value since the polymer component generated at the etching process is mainly comprised of C—C bond. The breakage of the second internal insulating film results from the use of etching gas at lower flow rates than the value. The breakage of the insulating film gives rise to an increase of junction leakage current, making it difficult to form the contact hole in self-alignment.

SUMMARY OF THE INVENTION

An objective of the present invention is to overcome the above problems encountered in prior arts and to provide a method for forming a contact hole of a semiconductor device, wherein a planarization layer of oxide is etched well by use of hydrogen-containing gas as an etchant while an underlying nitride layer is difficult to etch, thereby forming a self-aligned contact hole.

Another objective of the present invention is to provide a method for forming a contact hole of a semiconductor device, whereby the resultant semiconductor devices are significantly improved in characteristics and reliability and thus, can be highly integrated.

In accordance with the present invention, the above objectives are accomplished by a provision of a method for forming a contact hole of a semiconductor device comprising forming a word line and a first internal insulating film on a semiconductor substrate, forming an insulating film spacer at the side wall of the word line and the first internal insulating film, forming a nitride film as a second internal insulating film at a predetermined thickness on the resultant structure, forming a planarization layer on the second internal insulating film, etching the planarization layer in an atmosphere comprising $C_4F_8$ gas, Ar gas and a hydrogen-containing gas in the presence of a contact mask, to create a contact hole through which the second internal insulating film is exposed.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Figure 1:
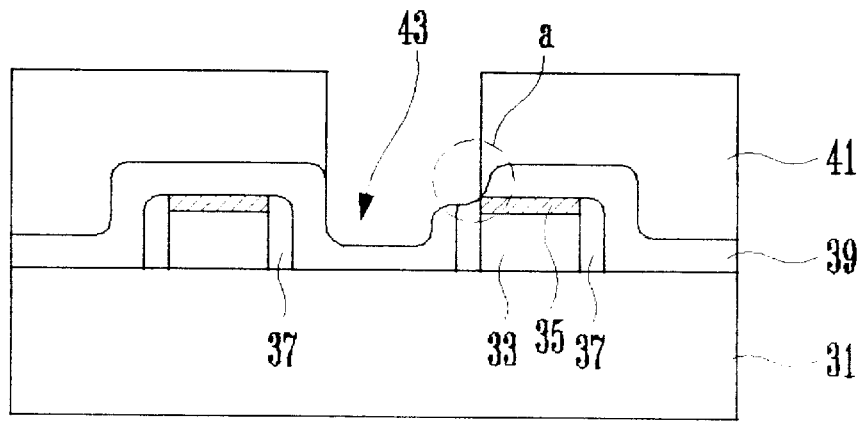
FIG. 1 is a schematic cross sectional view showing a conventional method for forming a contact hole of a semiconductor device.

The application of the preferred embodiment of the present invention is best understood with reference to the accompanying drawings, wherein like reference numerals are used for like and corresponding parts, respectively.

Referring to FIG. 2, process steps for forming a contact hole of semiconductor device according to the present invention are illustrated.

Figure 2A:
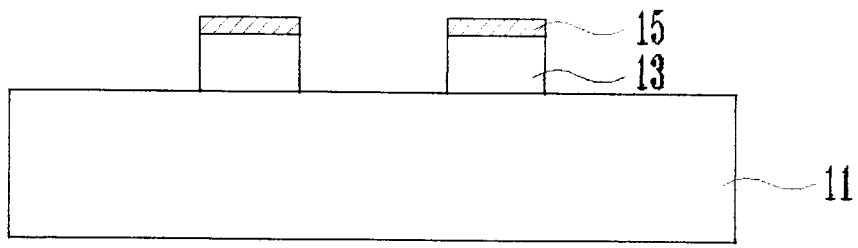
FIGS. 2A to 2D are schematic cross sectional views showing a method for forming a contact hole of a semiconductor device, according to the present invention.

First, a conduction layer and an insulating layer are sequentially deposited on a semiconductor substrate 11 and then, etched by use of a word line mask (not shown), to provide word lines 13 and first internal insulating films 15, respectively, both being identical in width, as shown in FIG. 2A.

Figure 2B:
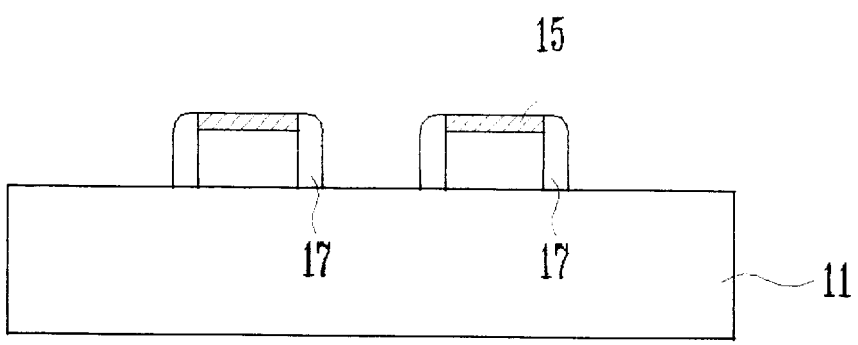

Next, an insulating spacer is formed at the side wall of a stack consisting of one word line 13 and one first internal insulating film 15, as shown in FIG. 2B. To this end, an insulating film is deposited at a predetermined thickness over the resulting structure of FIG. 2A and then, subjected to anisotropic etch. This insulating film may be formed of oxide or nitride with preference to the latter because of its dense structure.

Figure 2C:
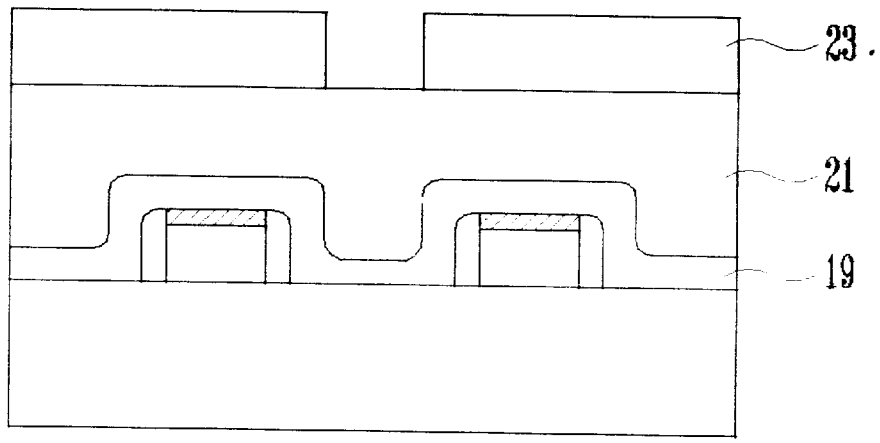

Subsequently, the resultant structure of FIG. 2A is covered with a predetermined thickness of a second internal insulating film 19. A nitride is preferred for the second internal insulating film 19, as shown in FIG. 2C. Then, a planarization layer 21 is formed over the top surface of the resultant structure. For the planarization layer 21, SOG or BPSG can be used with the preference to BPSG. A photoresist pattern 23 is provided on planarization layer 21. For this, a photoresist film is first deposited on the planarization layer 21 and then, etched by an exposure and developing process using a contact mask (not shown).

Figure 2D:
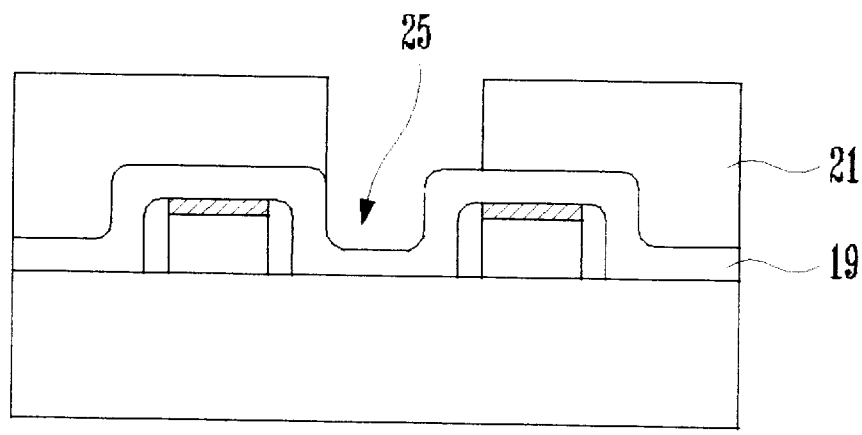

Thereafter, the planarization layer 21 is etched to form a contact hole 25 through which the second internal insulating film 19, a nitride, is exposed, in an etching atmosphere containing $C_4F_8$, Ar and a gas containing hydrogen with the photoresist film pattern 23 serving as a mask, as shown in FIG. 2D. Examples of the gas containing hydrogen include $CH_3F$, $C_2H_2$, $CH_2F_2$ and $CHF_3$. Upon etching, the etch ratio of the planarization layer 21, an oxide, to the second internal insulating film 19, a nitride, shows a range from 50 to 200. Accordingly, while the planarization layer 21 is etched, the second internal insulating film 19, a nitride, plays the role of etch barrier.

As to an etching condition for the oxide, 1000–3000 watt is set for source power and 500–2000 watt is set for bias power. During this etching process, $C_4F_8$ and Ar are allowed to flow at a rate of 5–30 sccm and 0–500 sccm, respectively. As the gas containing hydrogen, $CH_3F$ gas is used with a flow rate ranging 0from 30 sccm.

The hydrogen-containing gas generates C—H type polymers in a larger amount than conventional C—C type polymers. Since the bond strength of the C—H type polymer is weaker than that of C—C type polymer, the former is readily removed by oxygen, improving the etching stop during the etching of the planarization layer, an oxide. In contrast, the second internal insulating film 19, a nitride, is prevented from being damaged during the etching by the protecting action of the abundant C—H type polymer. Next, the photoresist pattern 23 is removed.

As described hereinbefore, the method for forming a contact hole of semiconductor device according to the present invention is characterized vy a hydrogen-containing gas being added as an etching gas component with the aim of generating C—H type polymers weaker in bond strength but at a larger amount than C—C type polymers, thereby preventing the etching stop phenomenon as well as the underlying layer damage caused by overetch during the etching process of a contact hole. This allows the contact hole to be formed without increasing junction leakage current, resulting in a significant improvement in characteristics and reliability and the high integration of a semiconductor device.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced in ways other than those specifically described.

What is claimed is:

1. A method for forming a hole of a semiconductor device, comprising:

forming a word line and a first internal insulating film on a semiconductor substrate;

forming an insulating film spacer at a side wall of the word line and the first insulating film so as to form a resulting structure;

forming a nitride film as a second internal insulating film on the resulting structure;

forming a planarization layer on the second internal insulating film;

in an atmosphere including $C_4F_8$ gas, Ar gas and a hydrogen-containing gas, etching the planarization layer under a contact mask to create a contact hole through which the second internal insulating film is exposed;

wherein the hydrogen containing gas is $C_2H_2$ gas that is added as an etching gas component so as to generate C—H type polymers that are weaker in bond strength but at a larger amount than C—C type polymers, so as to prevent an etching-stop phenomenon and underlying layer damage caused by over-etching during the etching step.

2. The method of claim 1, wherein the etching step is carried out:

at a source power of 1000–3000 watts;

at a bias power of 500–2000 watts;

at a $C_4F_8$ gas flow rate of 5–30 SCCM; and at an Ar gas flow rate of 0–500 SCCM.

3. The method of claim 2, wherein the etching step is carried out:

at a hydrogen-containing gas flow rate of 0–30 SCCM.

4. The method of claim 1, wherein the etching step is carried out:

at a hydrogen-containing gas flow rate of 0–30 SCCM.

5. The method of claim 1, wherein the etching step is carried out:

at an etch ratio of the planarization layer to the second internal insulating film of a range from 50 to 200.

6. A method for forming a hole of a semiconductor device, comprising:

forming a word line and a first internal insulating film on a semiconductor substrate;

forming an insulating film spacer at a side wall of the word line and the first insulating film so as to form a resulting structure;

forming a nitride film as a second internal insulating film on the resulting structure;

forming a planarization layer on the second internal insulating film;

in an atmosphere including $C_4F_8$ gas, Ar gas and a hydrogen-containing gas, etching the planarization layer under a contact mask to create a contact hole through which the second internal insulating film is exposed;

wherein the hydrogen containing gas is selected from $C_2H_2$ gas, $CH_3F$ gas, $CH_2F_2$ gas, and $CHF_3$ gas, and is added as an etching gas component so as to generate C—H type polymers that are weaker in bond strength but at a larger amount than C—C type polymers, so as to prevent an etching-stop phenomenon and underlying layer damage caused by over-etching during the etching step.

* * * * *